United States Patent [19]

Dempsey et al.

[11] 4,205,285
[45] May 27, 1980

[54] ACOUSTIC SURFACE WAVE DEVICE

[75] Inventors: Martin E. Dempsey, Acton; Ching W. Lee, Lexington, both of Mass.

[73] Assignee: GTE Laboratories Incorporated, Waltham, Mass.

[21] Appl. No.: 957,400

[22] Filed: Nov. 3, 1978

[51] Int. Cl.$^2$ .............. H03H 9/04; H03H 9/26; H03H 9/32
[52] U.S. Cl. .................. 333/194; 310/313; 333/196
[58] Field of Search .............. 333/150–155, 333/193–196; 310/313; 29/25.35, 594

[56] References Cited

U.S. PATENT DOCUMENTS

| 4,023,124 | 5/1977 | Parker et al. | 333/196 |
| 4,144,508 | 3/1979 | Lewis et al. | 333/196 |
| 4,158,823 | 6/1979 | Kuny et al. | 333/151 |

FOREIGN PATENT DOCUMENTS

| 2635192 | 3/1977 | Fed. Rep. of Germany | 333/196 |
| 2618144 | 11/1977 | Fed. Rep. of Germany | |

OTHER PUBLICATIONS

Tancrell et al.—"Wavefront Distortion of Acoustic Surface Waves from Apodized Interdigital Transducers" in Applied Physics Letters, vol. 19, No. 11 Dec. 1, 1971; pp. 456–459.

Primary Examiner—Marvin L. Nussbaum
Attorney, Agent, or Firm—David M. Keay

[57] ABSTRACT

An acoustic surface wave filter device having an input transducer of interleaved overlapping electrode structure. The portions of the inactive electrodes and the active electrodes outside the overlap envelope are combined into continuous uninterrupted metal layers. The elimination of electrode edges in the regions of the metal layers greatly reduces the problem of spurious signals caused by acoustic reflections from the edges.

2 Claims, 5 Drawing Figures

ACOUSTIC SURFACE WAVE DEVICE

BACKGROUND OF THE INVENTION

This invention relates to acoustic surface wave devices. More particularly, it is concerned with acoustic surface wave devices employed as filters.

Acoustic surface wave devices employing piezoelectric materials having suitable properties for propagating surface waves and having transducers for launching and receiving acoustic surface waves in the material are well-known. Typically, the transducers are arrays of interleaved conductive electrodes deposited on the material. In response to electrical signals an input or transmitting transducer launches acoustic surface waves along a predetermined path on the surface of the material. An output or receiving transducer detects the acoustic surface waves and generates electrical signals in response thereto. Typically, acoustic surface wave devices have been employed as delay lines and as filters. Because of the frequency response which can be obtained in an acoustic surface wave device by suitably designing the configuration of the transducer electrodes, particularly desirable bandpass characteristics can be achieved such as that required of an intermediate frequency filter for use in television receivers.

In the development of acoustic surface wave devices for use as filters various problems have been encountered. Several secondary effects are present which tend to degrade the performance of the device. Various techniques have been employed to compensate for or avoid certain of these secondary effects.

One undesirable secondary effect is known as wavefront distortion. In order to obtain the desired frequency response for certain types of filters the electrodes of the input transducer extending in opposite directions from the two bus bars are arranged to overlap. With varying overlap the number of metal electrodes traversed by a surface wave moving along its path of propagation varies across the span of the transducer aperture. Since the velocity of acoustic surface waves is affected by travelling under a metallized surface, the result is wavefront distortion. It has been found that this secondary effect can be avoided by the use of so-called "dummy" or inactive electrodes which extend toward each active electrode from the opposite bus bar so as to provide an overall generally rectangular configuration of the transducer. Thus all acoustic surface waves generated within the overlap region of the transducer aperture traverse essentially the same amount of metallized surface as they pass along the propagation path through the transducer.

Another secondary effect is acoustic reflections caused by impedance discontinuities in the propagating medium. This problem is corrected by the use of dual element electrodes in place of single element electrodes. With single element electrodes the electrodes are generally one-fourth of the principal wavelength wide and adjacent electrodes are generally separated by one-fourth of a wavelength. With the two element electrodes each element is one-eighth of a wavelength wide and adjacent elements are separated by one-eighth of a wavelength. The double element electrode configuration causes undesirable acoustic reflections to cancel each other. This technique is well-known and widely used to suppress what is known as triple transit echoes.

Another secondary effect problem is caused by reflections occurring at the edges of the electrodes with either single element or two element electrodes. Although double element electrode structures are efficient in suppressing reflections at the center frequency of the device, this action degrades gradually outward from the center frequency. In many types of acoustic surface wave devices the electrode structure is weighted as to amplitude and phase; that is, the length of the electrodes is varied to vary the overlap and the spacing between the electrodes is varied to produce phase weighting. The problem of reflections from electrode edges may be exaggerated in devices of this type. Although individual edge reflections are small, they can add in phase to significant values to become noticeable spurious signals.

One technique for reducing the problem of electrode edge reflections is disclosed in U.S. Pat. No. 4,023,124 which issued to D. W. Parker et al on May 10, 1977. In this patent the input transducer electrode structure disclosed employs single element electrodes in the overlap region and double element electrode structure for the inactive electrodes and for the connections to the active electrodes. As explained in the patent the primary purpose of this configuration is to permit the use of wider active electrodes in the overlap region and thus reduce problems in the fabrication of the thinner double element active electrodes while at the same time providing a metallized structure which will prevent wavefront distortion. However, this configuration employing single element electrodes in the overlap region fails to correct for problems of electrode interaction distortion which typically are eliminated by the use of double element electrodes.

SUMMARY OF THE INVENTION

Acoustic surface wave devices in accordance with the present invention provide operation with reduced spurious signals and without the reintroduction of other deleterious secondary effects. The device includes an acoustic surface wave propagating medium with a transducer on a surface of the medium for launching acoustic surface waves along a propagation path in the medium. The transducer includes first and second sets of interleaved electrodes of conductive material on the surface of the propagating medium with the electrodes extending transversely to the propagation path of the acoustic surface wave passing through the transducer. Portions of electrodes of the first set overlap portions of electrodes of the second set with the lengths of the overlapping portions varying along the propagation path. The overlapping portions define an overlap envelope and the maximum amount of overlap defines the acoustic aperture of the transducer lying transverse to the propagation path.

A first continuous uninterrupted layer of conductive material is located on the surface of the propagating medium and has the electrodes of the first set extending therefrom. The first continuous uninterrupted layer lies outside the overlap envelope and extends within the acoustic aperture. A second continuous uninterrupted layer of conductive material is located on the surface of the propagating medium and has the electrodes of the second set extending therefrom. The second continuous uninterrupted layer lies outside the overlap envelope and extends within the acoustic aperture. The total width of conductive material traversed by an acoustic surface wave propagated along the propagation path through the transducer is substantially the same over the span of the acoustic aperture.

An acoustic surface wave propagated along the propagation path passes through the same amount of metallized surface along the entire wavefront spanning the aperture of the transducer. Therefore, wavefront distortion caused by the wave traversing different widths of metallized surface across the span of the aperture does not occur. The continuous uninterrupted layer of conductive material outside the overlap envelope eliminate electrode edges in these regions and thus eliminate edge reflections in these portions of the propagation path.

Figure 1:
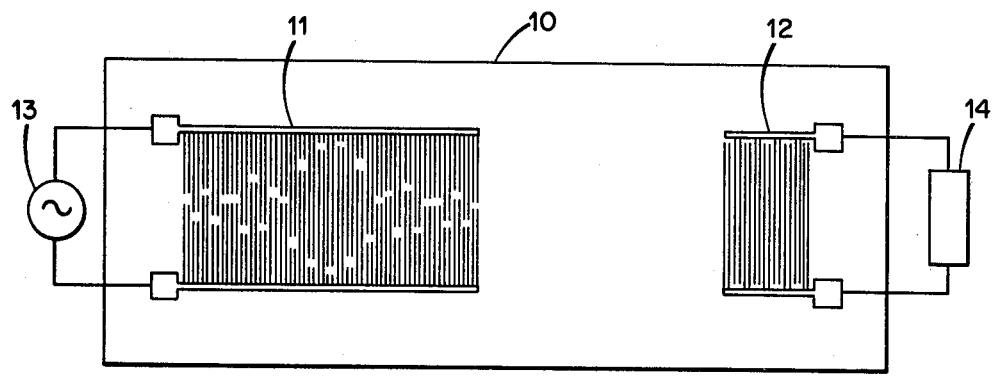
FIG. 1 is a schematic representation of a conventional prior art acoustic surface wave filter device.
Figure 2:
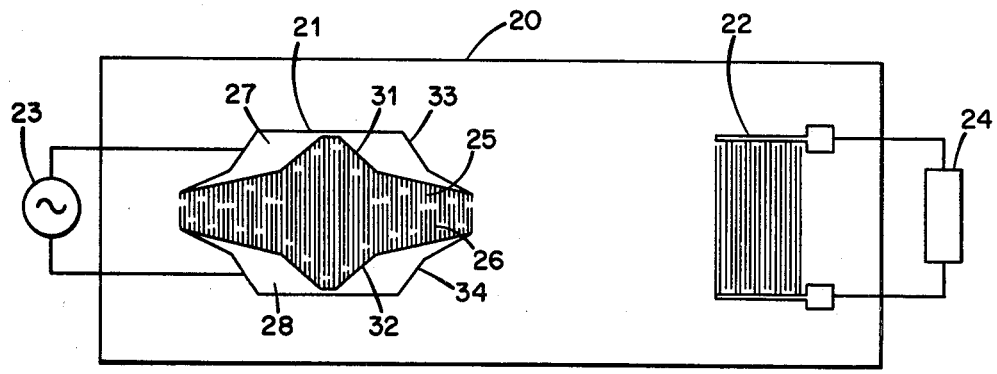
FIG. 2 is a schematic representation of an acoustic surface wave filter device in accordance with the present invention.

It should be noted that FIGS. 1 and 2 are schematic representations and thus do not show precisely the actual configuration, spacing, or number of conductive elements as present in actual devices.

For a better understanding of the present invention, together with other and further objects, advantages, and capabilities thereof, reference is made to the following disclosure and appended claims in connection with the above-described drawings.

DETAILED DESCRIPTION OF THE INVENTION

FIG. 1 is a schematic illustration of a known type of acoustic surface wave device which may be used, for example, as an intermediate frequency filter in television receivers. The device includes a substrate 10 of a suitable acoustic surface wave propagating material, for example, PZT, lithium niobate, or lithium tantalate. An input or transmitting transducer 11 of conductive material is deposited on the surface of the substrate 10 for launching acoustic surface waves along a propagation path in the substrate. An output or receiving transducer 12 is located across the propagation path in order to receive acoustic surface waves generated by the input transducer 11. A source of electrical signals 13 is connected to the input transducer 11 and the output transducer 12 is connected to a load 14.

The input transducer 11 as illustrated in FIG. 1 includes two sets of interleaved conductive electrodes deposited on the surface of the substrate of wave propagating material 10. As indicated in the figure, each electrode consists of two conductive elements and the electrodes are appropriately apodized and also weighted as to width and separation to produce a desired frequency response. The source of electrical signal energy 13 is connected across the two sets of electrodes. The input transducer 11 converts electrical energy from the source 13 to mechanical acoustic surface waves which propagate along the propagation path in the medium in a direction transverse to the direction in which the electrodes extend.

The output transducer 12 as shown in FIG. 1 also includes two sets of interleaved electrodes, each electrode being a double element. The electrodes are illustrated as being of equal length, although they may also be weighted. The width of each element and the spacing between adjacent elements is one-eighth of the wavelength of the resonant frequency of the device. The output transducer 12 receives the acoustic surface waves propagated toward it along the propagation path, detects them, and converts them into electrical signals which are applied to the load 14 connected across the two sets of electrodes.

As illustrated in FIG. 1 weighting of the interleaved electrodes by length results in an overlapping electrode structure. The maximum amount of overlap defines the acoustic aperture of the transducer across which the wavefront of the waves produced by the transducer extends. Each of the active electrodes is opposed by an inactive or dummy electrode from the opposite set of electrodes which extends toward it with a small gap in between. Thus, the quantity of metallized area traversed by all portions of an acoustic surface wave within the span of the acoustic aperture is the same and wavefront distortion does not occur.

However, as can be seen from FIG. 1 the wavefront passing from the maximum overlap through the remaining portion of the transducer encounters the edge surfaces of both the connections between the active electrodes and the bus bars and the edges of the inactive electrodes. As explained previously the interaction of the acoustic surface wave with these edges produces spurious signals. In acoustic surface wave devices of this type employed as intermediate frequency filters in television receivers these spurious signals appear as ghosts and multiple images.

FIG. 2 illustrates an acoustic surface wave device employing an input transducer in accordance with the present invention. The device also includes a substrate 20 of a suitable acoustic surface wave propagating material such as those recited hereinabove. An input or transmitting transducer 21 which will be described in detail hereinbelow is located on the surface of the substrate 20 for launching acoustic surface waves along a propagation path. An output or receiving transducer 22 is positioned to intercept the acoustic surface waves propagated along the propagation path. A source of electrical signals 23 is connected to the input transducer 21, and the output transducer 22 is connected to a suitable load 24.

For purposes of illustration the two sets of two element interleaved conductive electrodes 25 and 26 of the input transducer 21 have active portions which overlap to provide the same configuration of overlap and phase weighting as the prior art device illustrated in FIG. 1. The input transducer 21 includes two continuous uninterrupted films or layers of conductive material 27 and 28 on the surface of the substrate. The layers 27 and 28 are physically continuous and uninterrupted in the sense that they are not interspersed with electrode spaces but provide solid masses from which the electrodes of each set extend. The inner edges 31 and 32 of each metallized surface layer 27 and 28, respectively, generally follow the electrode overlap envelope and thus the layers extend within the acoustic aperture of the transducer which is defined by the interleaved electrodes having the maximum amount of overlap. In effect the continuous layers 27 and 28 serve as bus bars to which the signal source 23 is coupled and from which the active electrodes and inactive electrodes extend. The dimension of the metallized layers 27 and 28 along any line parallel to the central axis of the transducer is equal to the sum of the widths of the electrodes which would be removed in altering the device of FIG. 1 to that of FIG. 2. In other words, the amount of metallized surface traversed by a wave in passing from each electrode through the transducer along the direction of propagation is substantially equal for every point along the length of the electrode.

The structure of the input transducer of FIG. 2 as compared to that of FIG. 1 provides greatly reduced edge reflection in regions outside the active area of the overlap envelope. In addition, the configuration of the outer edges 33 and 34 of the continuous metallized layers 27 and 28, respectively, provide edges which do not lie normal to the propagation path. Thus any reflections at the outer edges 33 and 34 which do occur are not parallel to the propagation path and the reflected energy is directed away from the output transducer 22. Furthermore, the metallized areas 27 and 28 are relatively massive uninterrupted metallized areas with greater conductivity than the bus bars of the device of FIG. 1.

Figure 3:
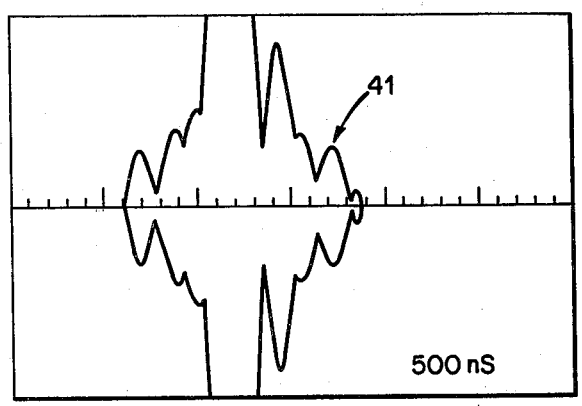
FIG. 3 is a curve illustrating the desired impulse response of a television intermediate frequency filter.
Figure 4:
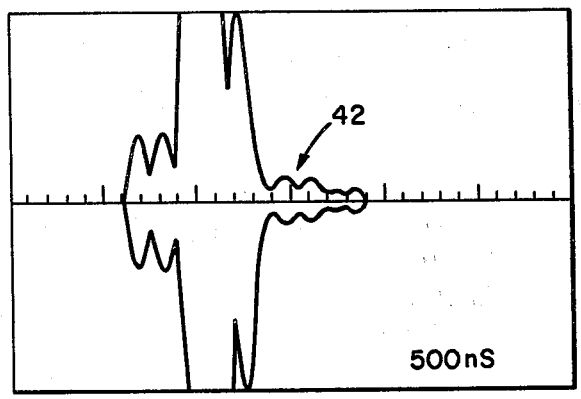
FIG. 4 is a curve illustrating the impulse response of a conventional prior art device of the type illustrated in FIG. 1.
Figure 5:
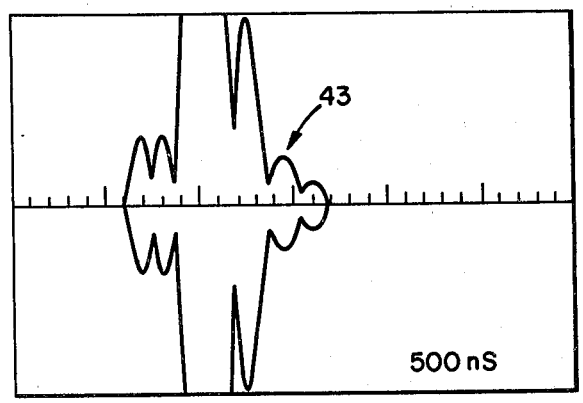
FIG. 5 is a curve illustrating the impulse response of an acoustic surface wave filter device in accordance with the present invention as illustrated in FIG. 2.

The suppression of spurious signals caused by acoustic reflections from the edges of the transducer electrodes achieved by devices in accordance with the present invention is illustrated by the curves of FIGS. 3, 4, and 5. FIG. 3 is a curve illustrating the design response to a single narrow pulse as desired for an intermediate frequency filter for television receivers. FIG. 4 is a curve illustrating the measured impulse response of a prior art device as illustrated in FIG. 1, and FIG. 5 is a curve illustrating the measured impulse response of a device in accordance with the present invention as illustrated in FIG. 2. These impulse response curves indicate that when the reflections from the electrode edges are not adequately suppressed (FIG. 4), the main signal tends to be more seriously distorted. In addition, in devices in accordance with the present invention the signals immediately following the main signal are suppressed on the order of 10 dB. In particular, the portion 43 of the curve in FIG. 5 is shown to be quite similar to the corresponding portion 41 in FIG. 3 while the corresponding portion 42 in FIG. 4 differs from that in FIG. 3. The response as shown in FIG. 4 tends to produce ghosts and multiple images when the device is employed as an intermediate frequency filter in television receivers.

While there has been shown and described what is considered a preferred embodiment of the present invention, it will be obvious to those skilled in the art that various changes and modifications may be made therein without departing from the invention as defined by the appended claims.

What is claimed is:

1. An acoustic surface wave device including an acoustic surface wave propagating medium and a transducer on a surface of said medium for launching acoustic surface waves along a propagation path in said medium; the transducer comprising first and second sets of interleaved electrodes of conductive material on the surface of the acoustic surface wave propagating medium with the electrodes extending transversely to the propagation path of acoustic surface waves through the transducer;

portions of electrodes of the first set overlapping portions of electrodes of the second set with the lengths of the overlapping portions varying along the direction of the propagation path;

the overlapping portions defining an overlap envelope and the maximum amount of overlap defining the acoustic aperture of the transducer lying transverse to the propagation path;

a first continuous uninterrupted layer of conductive material on the surface of the acoustic surface wave propagating medium having the electrodes of the first set extending therefrom, said first continuous uninterrupted layer lying outside the overlap envelope and extending within the acoustic aperture; and a second continuous uninterrupted layer of conductive material on the surface of the acoustic surface wave propagating medium having the electrodes of the second set extending therefrom, said second continuous uninterrupted layer lying outside the overlap envelope and extending within the acoustic aperture;

the total width of conductive material traversed by an acoustic surface wave propagated along the propagation path through the transducer being substantially the same over the span of the acoustic aperture;

the region of the first continuous uninterrupted layer of conductive material traversed by an acoustic surface wave propagated along the propagation path having an inner edge within the acoustic aperture generally following the overlap envelope, the electrodes of the first set extending from the first layer along the inner edge, and having an outer edge within the acoustic aperture;

the width of conductive material traversed by a line from the junction of each electrode of the first set with the inner edge of said region of the first layer through the transducer and parallel to the direction of the propagation path to the outer edge of said region of the first layer being substantially the same as the sum of the widths of the electrodes traversed by a line from the same electrode through the transducer parallel to the direction of the propagation path and lying centrally of the acoustic aperture;

the region of the second continuous uninterrupted layer of conductive material traversed by an acoustic surface wave propagated along the propagation path having an inner edge within the acoustic aperture generally following the overlap envelope, the electrodes of the second set extending from the second layer along the inner edge, and having an outer edge within the acoustic aperture;

the width of conductive material traversed by a line from the junction of each electrode of the second set with the inner edge of said region of the second layer through the transducer and parallel to the direction of the propagation path to the outer edge of said region of the second layer being substantially the same as the sum of the widths of the electrodes traversed by a line from the same electrode through the transducer parallel to the direction of the propagation path and lying centrally of the acoustic aperture;

and wherein the first and second sets of electrodes each have the same number of electrodes and the electrodes extend normal to the propagation path;

each active electrode of each set is positioned opposed to an inactive electrode of the other set;

the outer edge of each region of each of said layers of conductive material lies at an acute angle to the direction of the propagation path whereby reflections from said outer edge are not propagated along the propagation path.

2. An acoustic surface wave device including an acoustic surface wave propagating medium;

an input transducer on a surface of said medium for launching acoustic surface waves along a propagation path in said medium; and an output transducer on the surface of said medium across the propagation path for receiving and detecting acoustic surface waves propagated along the propagation path from the input transducer;

said input transducer comprising first and second sets of interleaved electrodes of conductive material on the surface of the acoustic surface wave propagating medium with the electrodes extending transversely to the propagation path of acoustic surface waves through the input transducer, portions of electrodes of the first set overlapping portions of electrodes of the second set with the lengths of the overlapping portions varying along the direction of the propagation path, the overlapping portions defining an overlap envelope and the maximum amount of overlap defining the acoustic aperture of the input transducer lying transverse to the propagation path, a first continuous uninterrupted layer of conductive material on the surface of the acoustic surface wave propagating medium having the electrodes of the first set extending therefrom, said first continuous uninterrupted layer lying outside the overlap envelope and extending within the acoustic aperture, and a second continuous uninterrupted layer of conductive material on the surface of the acoustic surface wave propagating medium having the electrodes of the second set extending therefrom, said second continuous uninterrupted layer lying outside the overlap envelope and extending within the acoustic aperture, the total width of conductive material traversed by the acoustic surface wave propagated along the propagation path through the input transducer being substantially the same over the span of the acoustic aperture; and said output transducer comprising two sets of interleaved electrodes on the surface of said medium with the electrodes extending transversely to the propagation path;

the region of the first continuous uninterrupted layer of conductive material traversed by an acoustic surface wave propagated along the propagation path having an inner edge within the acoustic aperture generally following the overlap envelope, the electrodes of the first set extending from the first layer along the inner edge, and having an outer edge within the acoustic aperture;

the width of conductive material traversed by a line from the junction of each electrode of the first set with the inner edge of said region of the first layer through the input transducer and parallel to the direction of the propagation path to the outer edge of said region of the first layer being substantially the same as the sum of the widths of the electrodes traversed by a line from the same electrode through the input transducer parallel to the direction of the propagation path and lying centrally of the acoustic aperture;

the region of the second continuous uninterrupted layer of conductive material traversed by an acoustic surface wave propagated along the propagation path having an inner edge within the acoustic aperture generally following the overlap envelope, the electrodes of the second set extending from the second layer along the inner edge, and having an outer edge within the acoustic aperture;

the width of conductive material traversed by a line from the junction of each electrode of the second set with the inner edge of said region of the second layer through the input transducer and parallel to the direction of the propagation path to the outer edge of said region of the second layer being substantially the same as the sum of the widths of the electrodes traversed by a line from the same electrode through the input transducer parallel to the direction of the propagation path and lying centrally of the acoustic aperture;

and wherein the first and second sets of electrodes of the input transducer each have the same number of electrodes and the electrodes extend normal to the propagation path;

each active electrode of each set is positioned opposed to an inactive electrode of the other set;

the outer edge of each region of each of said layers of conductive material lies at an acute angle to the direction of the propagation path whereby reflections from said outer edge are directed away from the output transducer.

* * * * *